United States Patent
Senoo (10) Patent No.: US 8,674,511 B2
(45) Date of Patent: Mar. 18, 2014

(54) METHOD OF FORMING A SEMICONDUCTOR DEVICE WITH A CONTACT PAD ON A SLOPED SILICON DIOXIDE SURFACE

(71) Applicant: Masaru Senoo, Okazaki (JP)

(72) Inventor: Masaru Senoo, Okazaki (JP)

(73) Assignee: Toyota Jidosha Kabushiki Kaisha, Toyota-shi, Aichi-ken (JP)

(*) Notice: Subject to any disclaimer, the term of this patent is extended or adjusted under 35 U.S.C. 154(b) by 0 days.

(21) Appl. No.: 13/645,681

(22) Filed: Oct. 5, 2012

(65) Prior Publication Data
US 2013/0034955 A1 Feb. 7, 2013

Related U.S. Application Data

(63) Continuation of application No. 12/742,936, filed as application No. PCT/JP2008/068889 on Oct. 17, 2008, now abandoned.

(30) Foreign Application Priority Data

Nov. 16, 2007 (JP) .................. 2007-298525

(51) Int. Cl.
*H01L 23/48* (2006.01)
*H01L 23/02* (2006.01)
*H01L 23/52* (2006.01)
*H01L 29/40* (2006.01)

(52) U.S. Cl.
USPC ............ 257/773; 257/678; 257/737; 257/738

(58) Field of Classification Search
USPC .................. 257/773, 678, 737, 738
See application file for complete search history.

(56) References Cited

U.S. PATENT DOCUMENTS 5,187,558 A 2/1993 Nakashima et al.
6,455,933 B1 * 9/2002 Akram et al. ................. 257/738

(Continued)

FOREIGN PATENT DOCUMENTS

GB 2 066 640 8/1981
JP 61-7648 1/1986

(Continued)

OTHER PUBLICATIONS

B. E. Deal and A. S. Grove, "General Relationship of the Thermal Oxidation of Silicon", Journal of Applied Physics, vol. 36, No. 12, p. 3770-3778 (1965).*

(Continued)

*Primary Examiner* — Long K Tran
*Assistant Examiner* — Dzung Tran
(74) *Attorney, Agent, or Firm* — Finnegan, Henderson, Farabow, Garrett & Dunner, LLP (57) ABSTRACT

A technique for expanding an effective area in which a semiconductor structure required for a semiconductor device to function is desired. With the semiconductor device 2 of this invention, a pad 12 to be connected with a conductive wire 14 is sloping with respect to the surface of the semiconductor device 2 around the pad 12 and along a longitudinal direction of the conductive wire 14. Consequently, the length of the pad 12, when projecting the pad 12 onto the surface of the semiconductor device 2, can be shortened. As a result, the area of the pad region 10 can be reduced and the effective area for forming a semiconductor structure can be enlarged.

4 Claims, 10 Drawing Sheets

(56) References Cited

U.S. PATENT DOCUMENTS

| | | | |
|---|---|---|---|
| 6,833,611 B2 * | 12/2004 | Liu et al. | 257/678 |
| 2004/0232531 A1 * | 11/2004 | Song | 257/678 |
| 2006/0024944 A1 | 2/2006 | Jung | |
| 2006/0151877 A1 * | 7/2006 | Yamashita et al. | 257/737 |
| 2007/0082475 A1 * | 4/2007 | Park | 438/612 |

FOREIGN PATENT DOCUMENTS

| | | | | |
|---|---|---|---|---|
| JP | 63-062337 | | 3/1988 | |
| JP | 01-189143 | | 7/1989 | |
| JP | 7-131075 | | 5/1995 | |
| JP | 2004-228479 | | 8/2004 | |
| JP | 2006-196597 | * | 7/2006 | H01L 21/60 |

OTHER PUBLICATIONS

Notification of Reasons for Rejection for JP Appl. No. 2007-298525 dated Sep. 6, 2011.

* cited by examiner

METHOD OF FORMING A SEMICONDUCTOR DEVICE WITH A CONTACT PAD ON A SLOPED SILICON DIOXIDE SURFACE

This is a continuation of application Ser. No. 12/742,936, which is a national phase application of International Application No. PCT/JP2008/068889, filed Oct. 17, 2008, and claims priority to Japanese Patent Application No. 2007-298525, filed on Nov. 16, 2007, the contents of all of which are hereby incorporated by reference into the present application.

TECHNICAL FIELD

The present invention relates to a semiconductor device comprising a surface on which a pad configured to be connected with a conductive wire is formed, and additionally relates to a device in which two points are connected with a conductive wire.

BACKGROUND ART

A wire bonding method for electrically connecting a semiconductor device to an external circuit or a semiconductor device to another semiconductor device is known. With the wire bonding method, a conductive wire in which one end is connected to the external circuit or the semiconductor device is pulled to a pad formed on the surface of the semiconductor device, the conductive wire is connected to the pad, and the extended portion of the conductive wire after being connected to the pad is cut. A device in which the pad is provided to the surface of the semiconductor device and the conductive wire is connected to the pad is disclosed in Japanese Published Patent Application No. 2004-228479 and Japanese Published Patent Application No. H07-131075.

There are semiconductor devices that require various types of pads. For example, a semiconductor device for use in power control requires at least one power pad to be connected with a conductive wire through which current to be controlled flows, and a small signal pad to be connected with a conductive wire which sends signals for switching the ON/OFF of the semiconductor device. The small signal pad may additionally include a pad to be connected with a conductive wire which sends signals corresponding to the amount of current flowing in the semiconductor device, and a pad to be connected with a conductive wire which sends signals corresponding to the temperature of the semiconductor device.

DISCLOSURE OF THE INVENTION

In many cases, it is difficult to form a semiconductor structure that is required for the semiconductor device to function at a semiconductor substrate that is positioned below the small signal pad to be connected with the conductive wire for sending signals. It may be necessary to prevent the operation of the semiconductor device from becoming unstable due to the voltage that is applied to the small signal pad, or it may be necessary to form a thick oxide film below the small signal pad in order to prevent the voltage in the small signal pad from changing beyond the designed range. In many cases it is not possible to manufacture the semiconductor structure in the range where the thick oxide film is formed. Accordingly, the larger the small signal pad, the smaller the range (effective region or active region) for forming the semiconductor structure that is required for the semiconductor device to function. Contrarily, if the small signal pad can be miniaturized, the effective region or the active region can be enlarged, and the characteristics of the semiconductor device can be improved. As exemplified above, there are cases where it would be desirable to miniaturize the area of the pad that occupies the surface of the semiconductor device.

In addition, although a small pad will suffice if the conductive wire is to be simply connected, a larger pad will be required if the extended portion of the conductive wire that is connected to the pad is to be cut. When cutting the conductive wire on the pad, the conductive wire that is connected to the pad is pressed against the pad with a tool, and the extended portion of the conductive wire is pulled and cut in the foregoing state. When the conductive wire is cut, a drag mark is created on the surface of the semiconductor device. It is necessary to prevent the protective film covering the surface of the semiconductor device from becoming damaged as a result of the drag mark being formed on the surface of the protective film. In order to prevent the surface of the protective film from becoming damaged due to the drag mark, the pad should cover the forming region of the drag mark. The pad will become enlarged since it is necessary to secure a drag mark forming region on the pad, and the effective area for manufacturing the semiconductor structure that is required for the semiconductor device to function will decrease. The present invention provides technology for enlarging the effective area by miniaturizing the area of the pad that occupies the surface of the semiconductor device.

A semiconductor device created in the present invention comprises a surface on which a pad configured to be connected with a conductive wire is formed. With the semiconductor device of the present invention, a region sloping with respect to the surface of the semiconductor device around the pad and along a longitudinal direction of the conductive wire to be connected with the pad is formed on a surface of the pad. If the surface of the pad is sloping with respect to the surface of the semiconductor device around the pad, the length of the pad, when projecting the pad onto the surface of the semiconductor device, can be shortened. Specifically, if the distance of the surface of the pad (distance along the surface of the pad) that is required for connecting the conductive wire is "L" and the angle in which the surface of the pad is sloping with respect to the surface of the semiconductor device is "θ", the length of the pad that is projected onto the surface of the semiconductor device will be L×cos θ, and can be shortened in comparison to the length L that is required in cases where the surface of the pad is not sloping. If the length of the pad that is projected onto the surface of the semiconductor device can be shortened, the range that is not covered by the pad; i.e., the effective area for forming a semiconductor structure that is required for the semiconductor device to function can be enlarged. If a sloping region is formed on the surface of the pad, the length of the pad that is projected onto the surface of the semiconductor device can be shortened, and the range that is not covered by the pad; i.e., the effective area for forming a semiconductor structure that is required for the semiconductor device to function can be enlarged.

Figure 6:
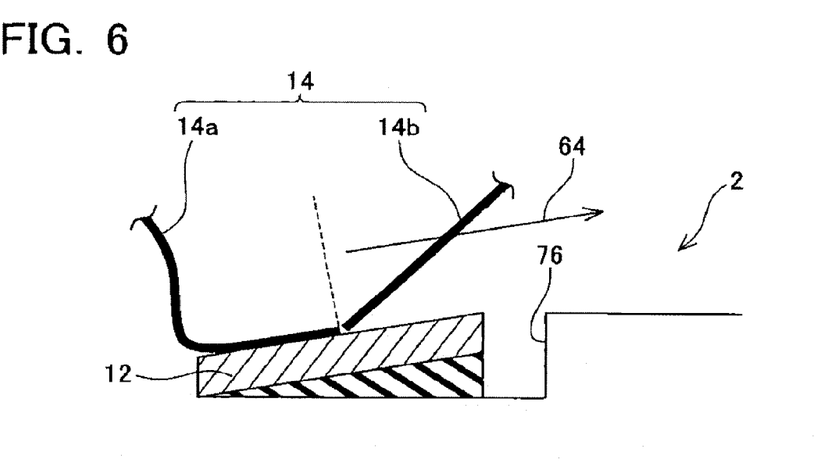
FIG. 6 is a view showing a frame format of the cross section of the semiconductor device 2.
Figure 7:
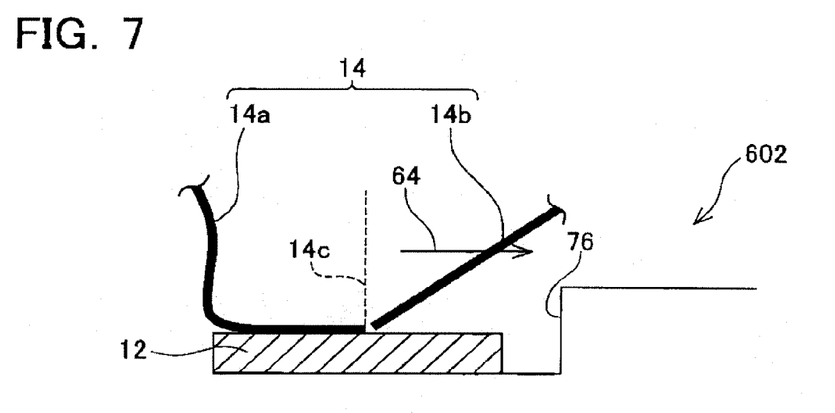
FIG. 7 shows a cross section of a semiconductor device 602 of the conventional technology.

In order to cut the conductive wire that is connected to the pad, the extended portion of the conductive wire that is connected to the pad is pulled from the pad. In a case where it will suffice by simply shortening the length of the pad that is projected onto the surface of the semiconductor device, the surface of the pad may be ascending or descending toward the side to which the conductive wire is to be pulled from the pad. Meanwhile, there are cases where the conductive wire cannot be pulled and cut due to the interference of objects around the pad. In order to minimize the foregoing interference, preferably, the pad surface is ascending from the surface of the semiconductor device toward the side to which the conductive wire is to be pulled. Specifically, preferably, the distance from the surface of the semiconductor device around the pad to the surface of the pad is expanding toward the side to which the conductive wire is to be pulled. For example, as shown in FIG. 7, even when connecting a conductive wire 14a to a pad 12 and pulling an extended portion 14b of the conductive wire in a direction that recedes from the pad 12 in order to cut the conductive wire at a position 14c, there are cases where the cutting process cannot be performed since a tool for gripping and pulling the extended portion 14b of the conductive wire will interfere with a structure 76 around the pad 12. In the foregoing case, as illustrated in FIG. 6, if the surface of the pad is sloping so that the surface of the pad ascends in the direction to which the conductive wire 14 is pulled, the tool for gripping and pulling the conductive wire 14 will no longer interfere with the structure 76. Even with a pad that could not have been bonded with conventional technology, a wire can be bonded by the surface of the pad sloping so that the surface of the pad ascends in the direction to which the conductive wire is pulled.

Figure 8:
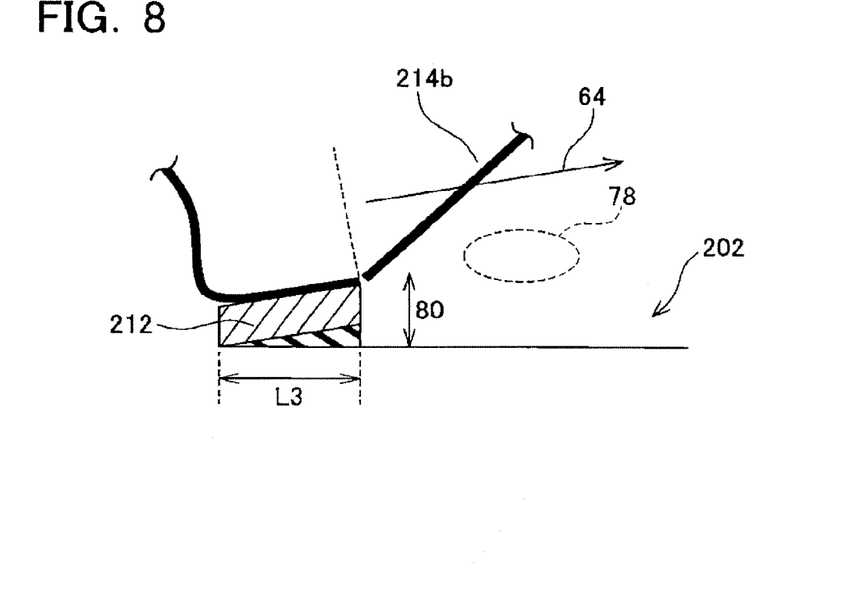
FIG. 8 shows a cross section of the semiconductor device 202 of the third embodiment.

If the surface of the pad is ascending in the pulling direction of the conductive wire, the tool for gripping and pulling the conductive wire can be moved to a direction that recedes from the surface of the semiconductor device, and a drag mark will no longer be formed on the surface of the semiconductor device around the pad. In the foregoing case, there is no need to prepare a drag mark forming region on the pad, and it is possible to eliminate the drag mark forming region from the pad. If the drag mark forming region is eliminated from the pad, the pad can be further miniaturized. For example, as illustrated in FIG. 8, if the surface of the pad is ascending in the pulling direction of the conductive wire, it is possible to secure a difference in height 80 between the surface of the pad and the surface of the semiconductor substrate around the surface of the pad. Thus, even if the drag mark forming region is eliminated from the pad, the drag mark will not be formed on the surface of the semiconductor substrate around the pad. With the drag mark forming region having been eliminated, it will suffice to simply use a pad having a length that is required for connecting the conductive wire. Thus, the pad can be further miniaturized.

In order to form the pad having the sloping surface on the surface of the semiconductor substrate, preferably, an oxide film may be interposed between the pad and the semiconductor substrate, and the thickness of the oxide film may be sloped. If ions for slightly increasing an oxidation rate are injected into a thin part of the oxide film, and ions for greatly increasing the oxidation rate are injected into a thick part of the oxide film, the thickness of the oxide film can be sloped. If ions for slightly increasing the oxidation rate are injected into the surface of the semiconductor substrate and subsequently the semiconductor substrate is oxidized, a thin oxide film is formed. If ions for greatly increasing the oxidation rate are injected into the surface of the semiconductor substrate and subsequently the semiconductor substrate is oxidized, a thick oxide film is formed. An oxide film in which the thickness thereof is changing (sloping) is formed between the two regions. Since the volume will expand during oxidation, the surface of the oxide film will rise to be higher than the surface of the peripheral semiconductor substrate. As a result of forming a pad on the surface of the oxide film in which the thickness thereof is sloping, a pad having a surface that is sloping with respect to the surface of the semiconductor device around the pad can be easily formed.

In substitute for changing the type of ions to be injected, the injection density of the ions can be changed. If ions for increasing an oxidation rate are injected at a low density and subsequently the semiconductor substrate is oxidized, a thin oxide film is formed. If ions for increasing the oxidation rate are injected at a high density and subsequently the semiconductor substrate is oxidized, a thick oxide film is formed. An oxide film in which the thickness thereof is changing (sloping) is formed between the two regions. As a result of forming the pad on the surface of the oxide film in which the thickness thereof is sloping, the pad having the surface that is sloping with respect to the surface of the semiconductor device around the pad can be easily formed.

Figure 11:
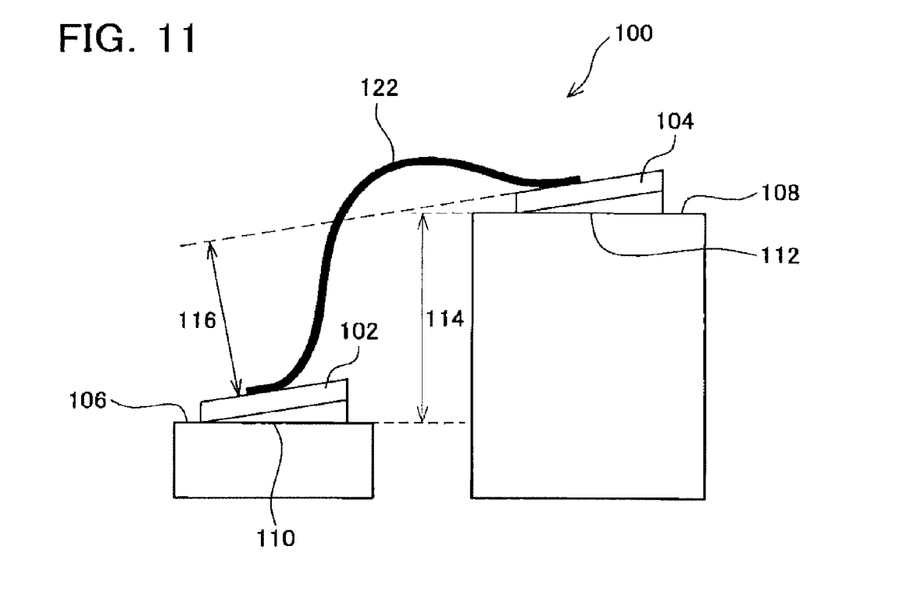
FIG. 11 shows a device 100 of the sixth embodiment.
Figure 12:
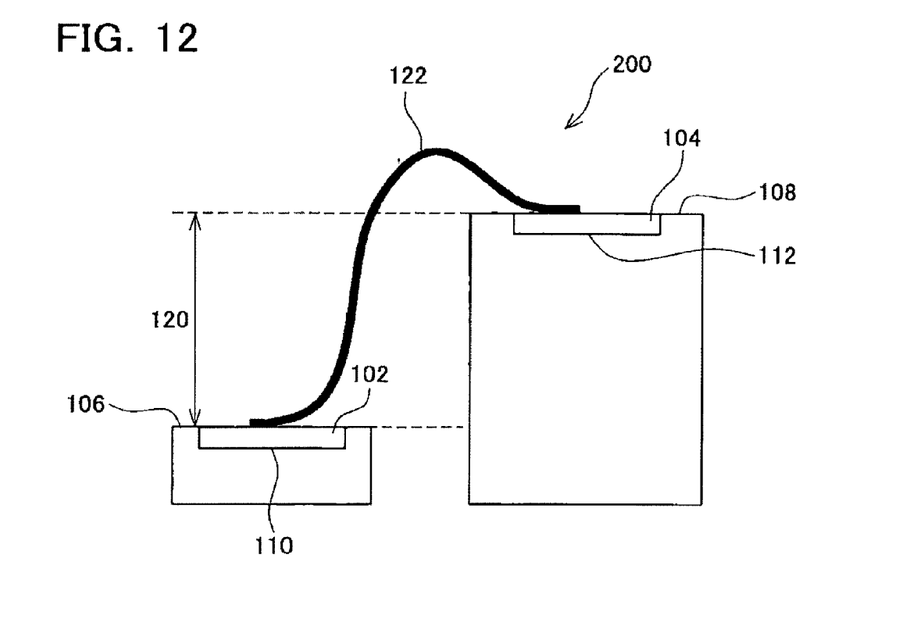
FIG. 12 shows a device 200 of conventional technology.

By using the pad having the sloping surface, the difference in height between the two connecting points to which both ends of the conductive wire are bonded can be substantially reduced to stabilize the bonding. Assume that a first connecting point at which one end of the conductive wire is connected is on a first plane, and a second connecting point at which other end of the conductive wire is connected is on a second plane. Further assume that the first plane is at a lower level than the second plane, the first plane and the second plane are mutually parallel, and further parallel to the surface of the semiconductor device other than the pad. In the foregoing case, if a first pad having a sloping surface ascending toward the second connecting point is formed on the first connecting point, and a second pad having a sloping surface descending toward the first connecting point is formed on the second connecting point, the difference in height between the first connecting point and the second connecting point will substantially decrease. For example, as illustrated in FIG. 12, when connecting a first pad 102 and a second pad 104 with a conductive wire 122, a difference in height 120 will exist between the surface of the first pad 102 and the surface of the second pad 104 if the surface of the first pad 102 and the surface of the second pad 104 are not sloping. Meanwhile, as illustrated in FIG. 11, if the surface of the first pad 102 is ascending toward the second pad 104 and the surface of the second pad 104 is descending toward the first pad 102, the difference in height existing between the surface of the first pad 102 and the surface of the second pad 104 will become a difference in height 116, and will decrease in comparison to the difference in height 120. If the difference in height existing between the surface of the first pad 102 and the surface of the second pad 104 is reduced, the stability of the wire bonding can be improved.

With the device of the present invention, preferably, the sloping surface of the first pad and the sloping surface of the second pad are parallel to a plane including the first connecting point and the second connecting point. Accordingly, the difference in height that exists between the surface of the first pad and the surface of the second pad can be effectively reduced.

According to the present invention, it is possible to reduce the projected area of the pad that is projected onto the surface of the semiconductor device around the pad. Consequently, it is possible to enlarge the effective area for forming a semiconductor structure that is required for the semiconductor device to function, and thereby improve the electrical properties of the semiconductor device.

DETAILED DESCRIPTION OF THE PREFERRED EMBODIMENTS

The primary features of the embodiments explained below are foremost summarized.

(Feature 1) A top surface of a semiconductor device and a bottom surface of the semiconductor device around a pad are parallel.

(Feature 2) A wire bonding process is performed in a state where the semiconductor device is fixed to a wire bonding device so that the top surface of the semiconductor device around the pad is sloping and the surface of the pad is horizontal.

(Feature 3) The semiconductor device is fixed to the wire bonding device so that the top surface of the semiconductor device around the pad is horizontal and the surface of the pad is sloping. The wire bonding process is performed in a state where tool of the wire bonding device which grips and moves the conductive wire is sloped so that the tool is perpendicular to the surface of the pad. The tool moves in parallel to the sloping surface of the pad and cuts the wire.

First Embodiment

Figure 1:
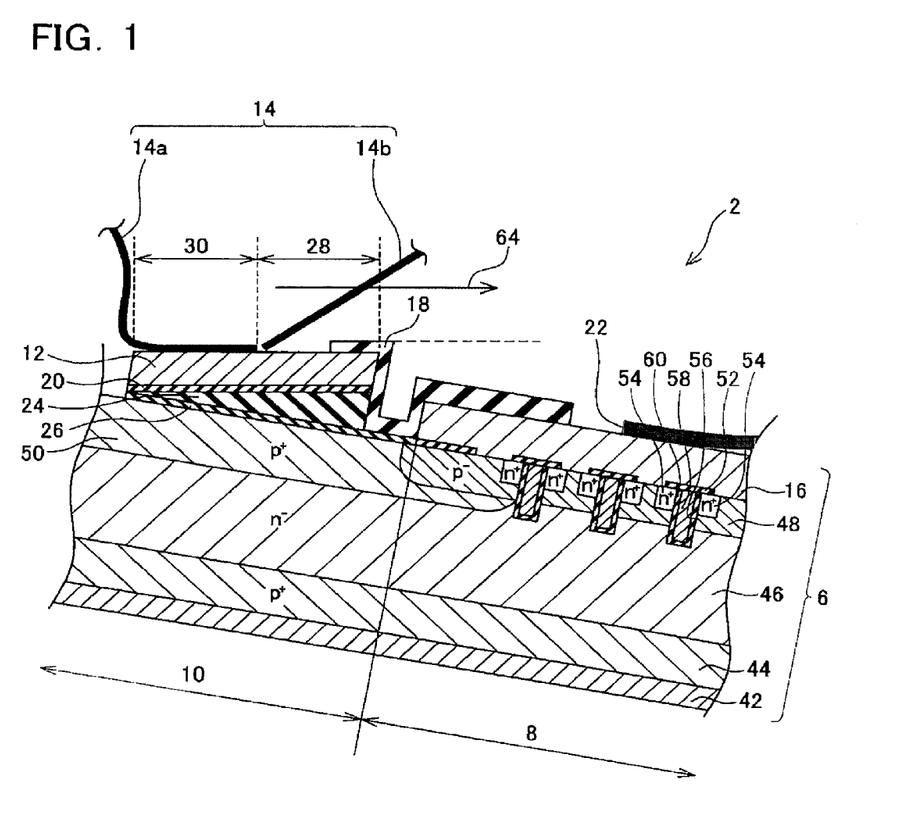
FIG. 1 shows a cross section of a semiconductor device 2 of the first embodiment.

FIG. 1 shows a cross section of the semiconductor device 2 that embodies the present invention. An emitter electrode pad 16 and a pad 12 to be connected with a conductive wire 14 (hereinafter sometimes referred to as a wire 14) are formed on the top surface of the semiconductor device 2. The pad 12 is connected to a trench gate electrode 58 which will be described later, and delivers a voltage, which was applied from an external circuit (not shown) to the conductive wire 14, to the trench gate electrode 58. The top surface of the semiconductor device 2 except for a range thereof for ensuring the conduction with the electrode is covered with a thin field oxide film 26 having a uniform thickness. An oxide film 24 is formed on a range of the field oxide film 26 where the pad 12 is formed on the upper side. The surface of the oxide film 24 is sloping with respect to the top surface of the semiconductor device 2 around the pad 12. The surface of the oxide film 24 is covered with a thin interlayer dielectric film 20 having a uniform thickness. The pad 12 is formed on the surface of the interlayer dielectric film 20. The film thickness of the pad 12 is uniform. Since the surface of the oxide film 24 is sloping, the surface of the pad 12 is sloping with respect to the top surface of the semiconductor device 2 around the pad 12. A protective film (passivation film) 18 is formed on the top surface of the semiconductor device 2 across a range from the end of the pad 12 to the end of the emitter electrode pad 16. A conductive wire 22 is bonded to the emitter electrode pad 16 that is exposed to the surface of the active region 8 of the semiconductor device 2. The conductive wire 22 electrically connects between the external circuit (not shown) and the emitter electrode pad 16. A semiconductor substrate 6 is sectionalized into an active region 8 for manufacturing a semiconductor structure that is required for the semiconductor device 2 to function, and a pad region 10 on which the pad 12 is formed. It is difficult to form the semiconductor structure, which is required for the semiconductor device 2 to function, in the semiconductor substrate 6 in the pad region 10. The smaller the pad region 10 is, a larger active region 8 can be secured.

An insulation gate bipolar transistor (i.e., "IGBT") is formed in the active region 8 of the semiconductor device 2. The semiconductor device 2 is formed from the semiconductor substrate 6 containing a low concentration of n-type impurities, and a drift region 46 is formed by the portion of the semiconductor substrate 6 remaining in an unprocessed state. A body region 48 containing a high concentration of p-type impurities is formed at the top surface side of the drift region 46. An emitter region 54 containing a high concentration of n-type impurities is formed at a position facing the top surface of the body region 48. The emitter region 54 is separated from the drift region 46 by the body region 48. A trench 56, which extends from the top surface of the emitter region 54, penetrates the emitter region 54 and the body region 48 and reaches the drift region 46, is formed. A bottom surface and a wall surface of the trench 56 are covered with a gate insulation film 60, and a trench gate electrode 58 is filled inside the trench 56. The top surface of the trench gate electrode 58 is covered with an interlayer dielectric film 52. The emitter electrode pad 16 is formed on the top surface of the semiconductor device 2 in the active region 8. The emitter electrode pad 16 is conducting with the emitter region 54 and the body region 48, and insulated from the trench gate electrode 58 by the interlayer dielectric film 52. A P-type diffusion region 50 containing a high concentration of p-type impurities is formed on the top surface side of the pad region 10 of the semiconductor device 2. The P-type diffusion region 50 is connected to the terminal end of the body region 48 containing p-type impurities, and electrically conducting therewith. A collector region 44 containing a high concentration of p-type impurities is formed on the bottom surface side of the semiconductor device 2. A collector electrode 42 is formed on the bottom surface of the semiconductor device 2. The collector electrode 42 is conducting with the collector region 44.

With the semiconductor device 2 of this embodiment, as shown in FIG. 1, the semiconductor device 2 is fixed to the bonding device (not shown) in a sloping state so that the surface of the pad 12 is horizontal. The bonding device connects the conductive wire 14 to the bonding region 30 of the pad 12. Prior to this, the end (not shown) of the wire 14 is connected to an external circuit. After the wire 14 is connected to the pad 12, the bonding device pulls the extended portion 14b of the wire 14 in the direction of the arrow 64 and then cuts the wire 14.

Figure 13:
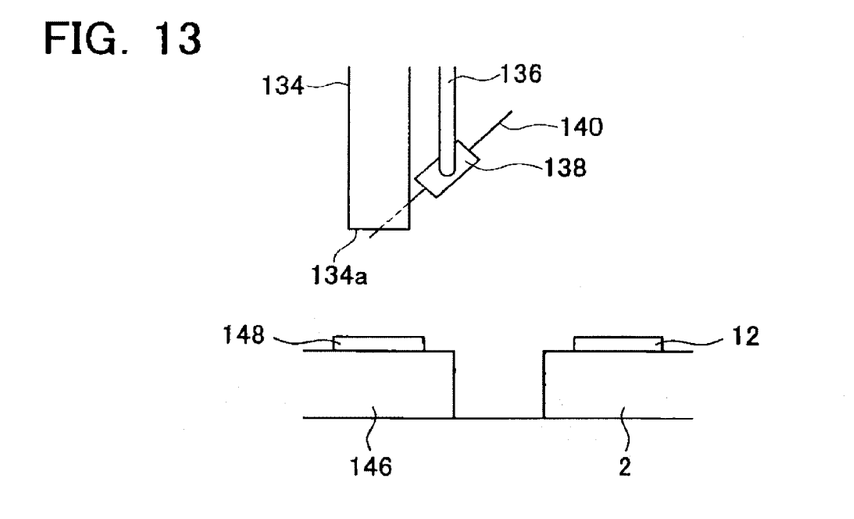
FIG. 13 shows a process of a wire bonding method.
Figure 14:
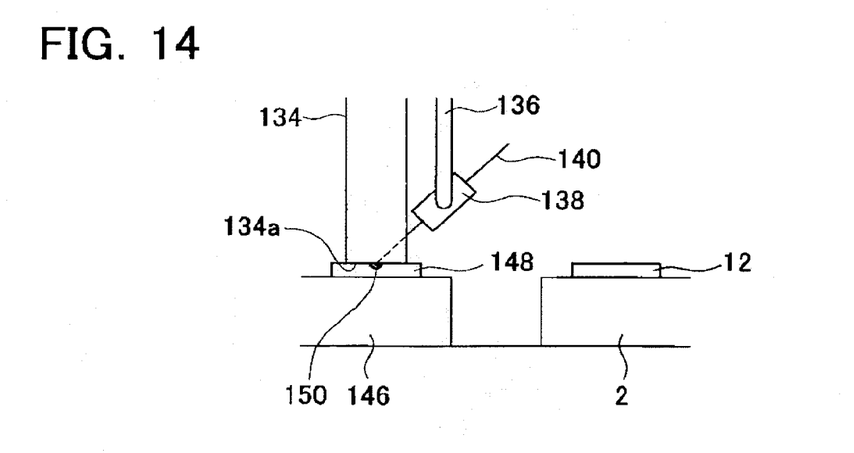
FIG. 14 shows the process of the wire bonding method.
Figure 15:
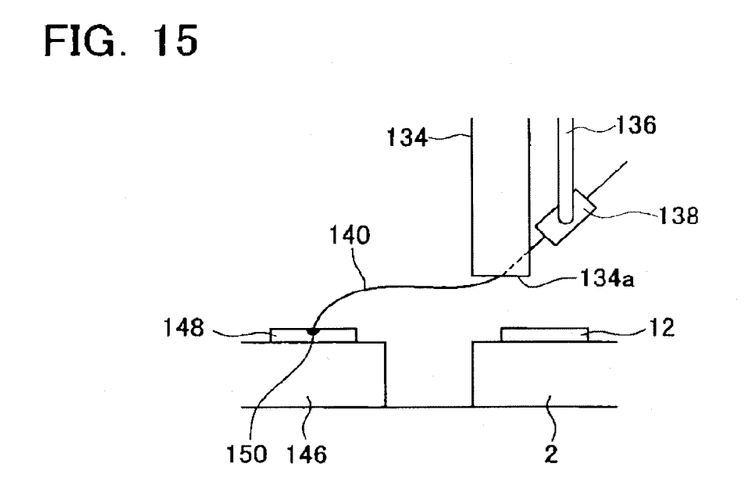
FIG. 15 shows the process of the wire bonding method.
Figure 16:
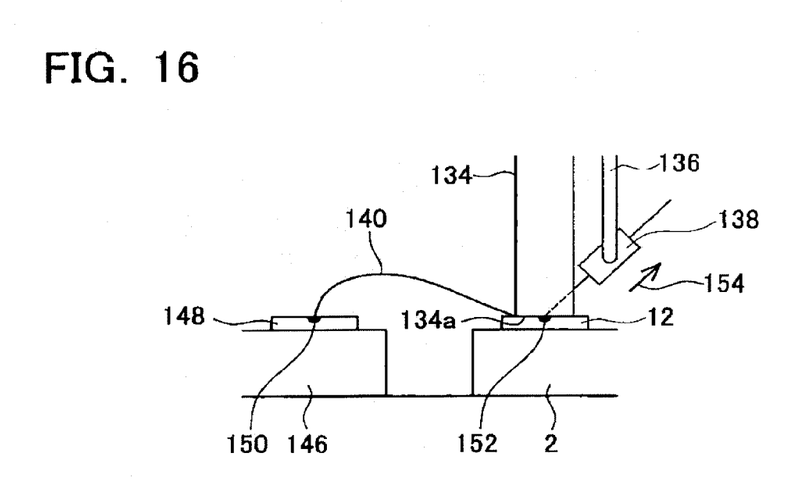
FIG. 16 shows the process of the wire bonding method.

FIGS. 13 to 17 show the method of wire-bonding the external circuit 146 and the semiconductor device 2. As shown in FIG. 13, the wire 140 passes through a clamp 138 and a wedge tool 134 of the bonding device and the tip thereof is protruding from a bottom surface 134a of the wedge tool 134. The clamp 138 has a function of gripping the wire 140. The clamp 138 is coupled with the wedge tool 134 via a support 136, and the clamp 138 and the wedge tool 134 are able to move relatively. With this wire bonding method, foremost, as shown in FIG. 14, the bottom surface 134a of the wedge tool 134 is pressed against a pad 148 of an external circuit 146, and ultrasonic vibration is applied to the wire. As a result, the pad 148 and the wire 140 are bonded. A bonding mark 150 is formed on the surface of the pad 148. Next, as shown in FIG. 15, the wire 140 and the clamp 138 and the wedge tool 134 are wholly moved onto the pad 12 of the semiconductor device 2 which is the subsequent bonding destination. Here, the wire 140 is pulled from the bottom surface 134a of the wedge tool 134. Subsequently, as shown in FIG. 16, the bottom surface 134a of the wedge tool 134 is pressed against the pad 12 of the semiconductor device 2, and ultrasonic vibration is applied to the wire. As a result, the pad 12 and the wire 140 are bonded. A bonding mark 152 is formed on the surface of the pad 12.

Figure 17:
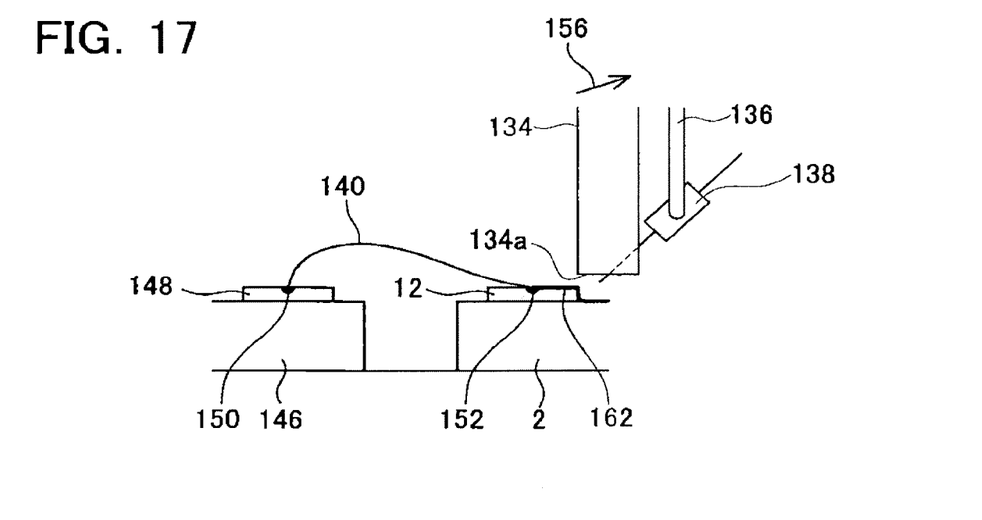
FIG. 17 shows the process of the wire bonding method.
Figure 18:
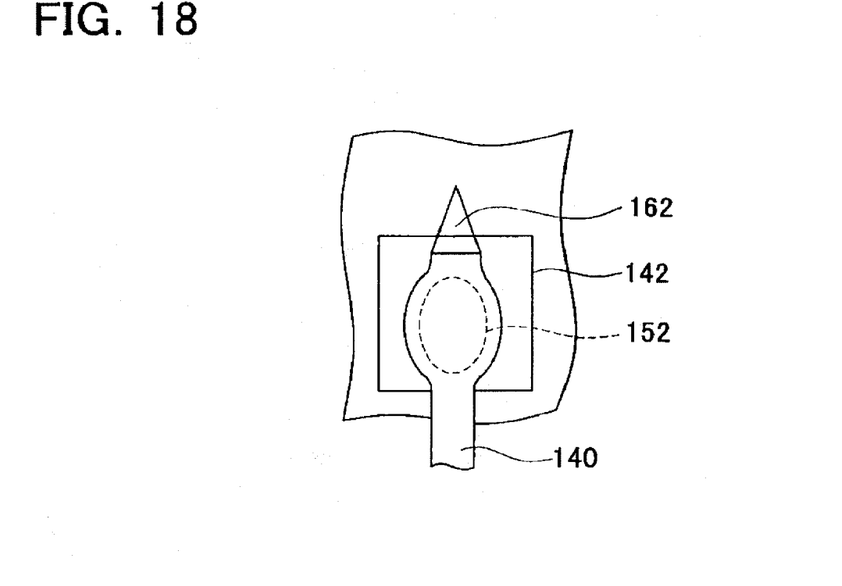
FIG. 18 shows problems of the conventional technology in the wire bonding method.

After bonding the wire 140 to the pad 12, as shown in FIG. 16, the clamp 138 is moved in the direction of the arrow 154 with respect to the wedge tool 134 while leaving the wedge tool 134 on the pad 12. Consequently, the wire 140 which is sandwiched between the pad 12 and the wedge tool 134 will be torn off. Here, as shown in FIG. 17, the torn off wire 140 forms a drag mark 162 on the surface of the pad 12. Subsequently, the wedge tool 134 and the clamp 138 are integrally raised in the direction of the arrow 156, and the wire bonding method is thereby completed. As shown in FIG. 18, if the pad 12 has the area roughly the same as the area of the bonding mark 152, the drag mark 162 is formed beyond the pad 12, and the protective film formed on the top surface of the semiconductor device 2 is damaged. If the protective film is damaged, impurities and the like will enter from the damage into the semiconductor device 2, and cause the deterioration in characteristics and damage of the semiconductor device 2. Thus, when cutting the wire 140 on the pad 12, it is necessary to form the pad 12 having an enlarged area including the forming range of the drag mark 162.

Cases that the drag mark 162 is formed on the pad 12 of the semiconductor device 2 are not limited to the cases of tearing off the wire 140. If the wedge tool 134 is provided with a wire cutter for cutting the wire 140, a drag mark 162 will also be formed when the wire 140 is cut by the wire cutter. In the foregoing case also, it is necessary to enlarge the pad 12 so that the drag mark 162 will be within the pad 12 in order to prevent the protective film of the semiconductor device 2 from becoming damaged.

With the semiconductor device 2 of this embodiment, as shown in FIG. 1, the pad 12 is formed broadly to include the drag mark forming region 28 in addition to the bonding region 30 that is required for connecting the conductive wire 14. Both the bonding region 30 and the drag mark forming region 28 are formed in a slope with respect to the top surface of the semiconductor device 2 other than the pad 12. Thus, the drag mark will not be formed beyond the pad 12.

Figure 2:
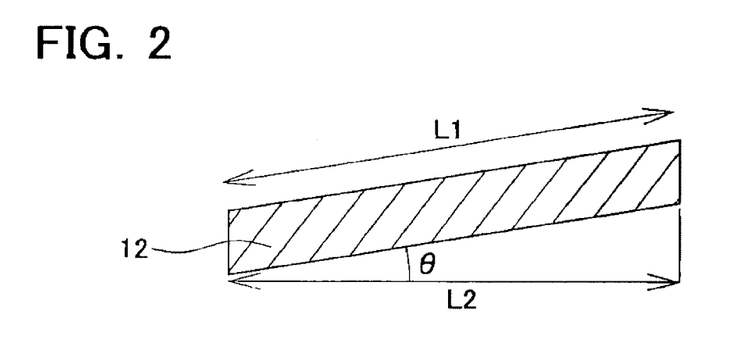
FIG. 2 shows an enlarged cross section of a pad 12.

The pad 12 of the semiconductor device 2 of this embodiment is formed in a sloping manner with respect to the top surface of the semiconductor device 2 other than the pad 12 and along a longitudinal direction of the wire 14. Thus, as shown in FIG. 2, the length L2 of the pad 12 when viewed from a direction that is perpendicular to the top surface of the semiconductor device 2 can be made shorter than the length L1 measured along the surface of the pad 12. If the angle of slope of the surface of the pad with respect to the top surface of the semiconductor device 2 is θ, L2=L1×cos θ, and the relation of L2<L1 can be obtained.

Figure 3:
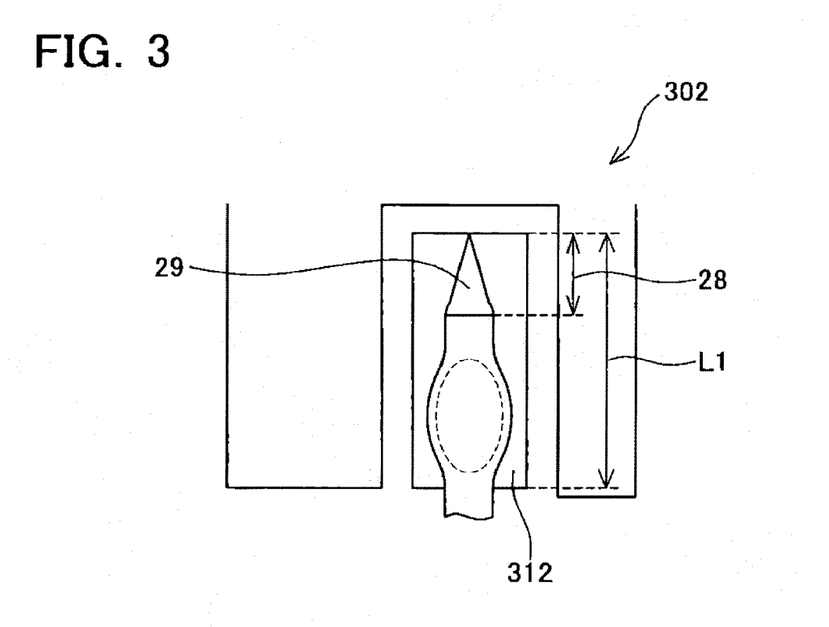
FIG. 3 shows a pad 312 of a conventional technology from a direction that is perpendicular to the surface of a semiconductor device 302.
Figure 4:
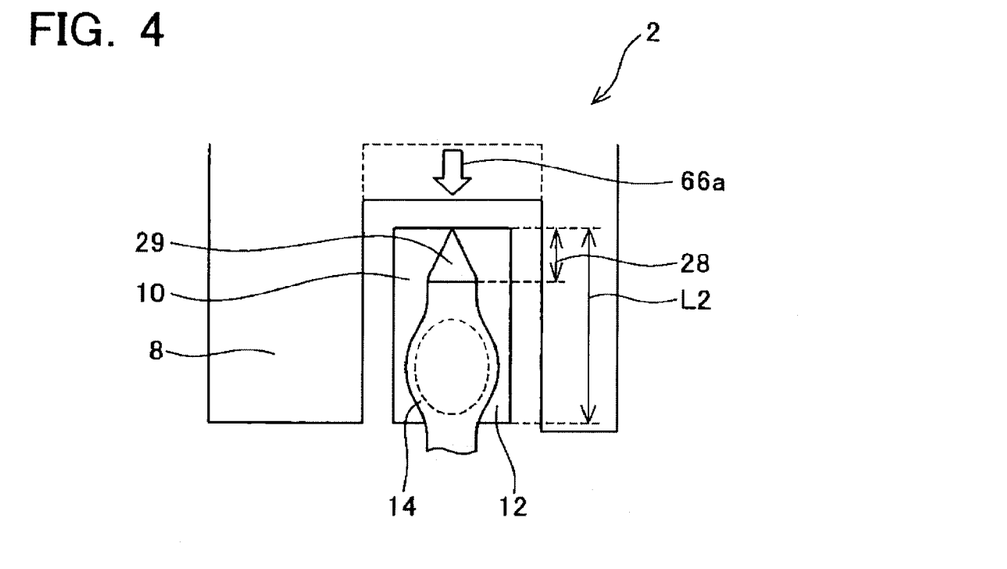
FIG. 4 shows the pad 12 of the first embodiment from a direction that is perpendicular to the surface of the semiconductor device 2.

FIG. 3 is a diagram showing the vicinity of a pad 312 of a conventional semiconductor device 302 from a direction that is perpendicular to the top surface of the semiconductor device 302. The pad 312 is formed broadly to include the drag mark forming region 28 in which the drag mark 29 is formed, and the length of the pad 312 projected to the top surface of the semiconductor device 302 is L1. FIG. 4 is a diagram showing the vicinity of the pad 12 of the semiconductor device 2 of this embodiment from the direction that is perpendicular to the top surface of the semiconductor device 2. The pad 12 is also formed broadly to include the drag mark forming region 28, and the length of the pad 12 projected to the top surface of the semiconductor device 2 is L2. With the semiconductor device 2, the area of the pad region 10 can be reduced as shown with the arrow 66a. It is thereby possible to enlarge the area of the active region 8, and improve the electrical properties of the semiconductor device 2.

Second Embodiment

FIG. 6 shows a cross section of the semiconductor device 2 according to the second embodiment of the present invention. A pad 12 is formed on the top surface of the semiconductor device 2 of the second embodiment. The pad 12 ascends toward the direction 64 which the conductive wire is pulled. A structure 76 is formed on the position closer to the side, to which the extended portion 14b of the conductive wire is to be pulled, than the pad 12. FIG. 7 shows a semiconductor device 602 of conventional technology in which the same structure 76 as FIG. 6 is formed and the pad 12 is not sloping with respect to the top surface of the semiconductor device 2 other than the pad 12. With the semiconductor device 602, even when connecting the conductive wire 14a to the pad 12 and pulling the extended portion 14b of the conductive wire from the pad 12 in the pulling direction 64 in order to cut the extended portion 14b of the conductive wire at a position 14c, the cutting process cannot be performed since a tool for gripping and pulling the extended portion 14b of the conductive wire will interfere with a structure 76 located around the pad 12. The conductive wire 14 cannot be connected to the pad 12. With the semiconductor device 2 of this embodiment, as shown in FIG. 6, since the surface of the pad 12 is sloping so that the surface of the pad 12 ascends according to the side of the direction 64 to which the extended portion 14b of the conductive wire is pulled, the tool for gripping and pulling the extended portion 14b of the conductive wire does not interfere with the structure 76. Thus, as a result of pulling the extended portion 14b of the conductive wire from the pad 12 in the pulling direction 64, the extended portion 14b of the conductive wire cab be cut, and the conductive wire 14 can be bonded to the pad 12. Even though the conventional technology cannot bond, the conductive wire 14 can be connected if the surface of the pad is sloping so that the surface of the pad ascends in the direction 64 to which the extended portion 14b of the conductive wire 14 is pulled.

Third Embodiment

Figure 5:
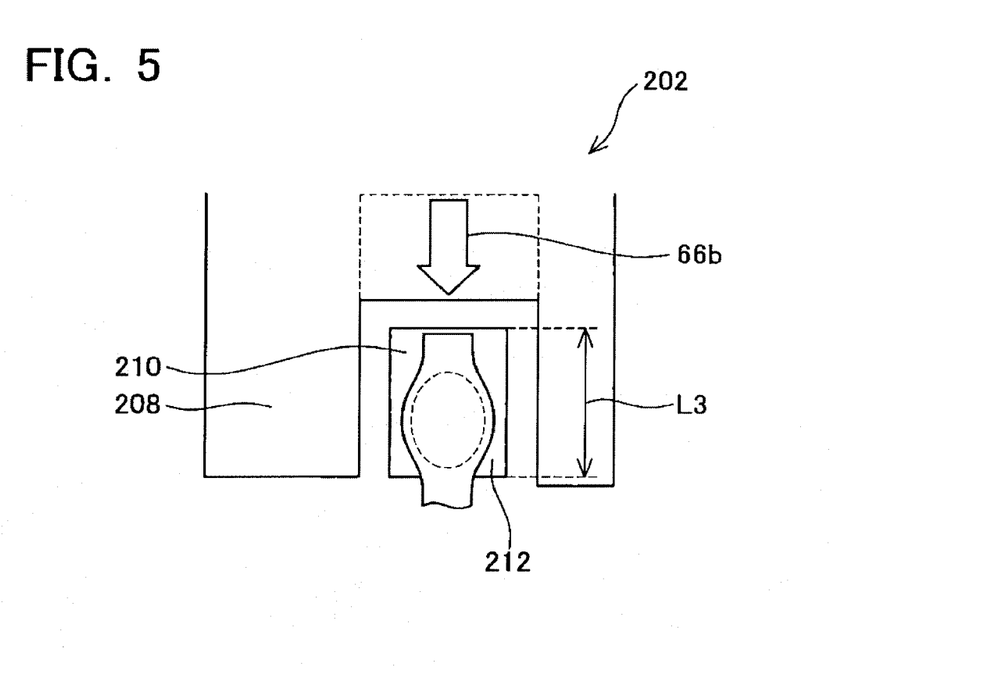
FIG. 5 is a diagram showing a pad 212 of the third embodiment from a direction that is perpendicular to the surface of a semiconductor device 202.

FIG. 8 shows a cross section of the semiconductor device 202 according to the third embodiment of the present invention. With the semiconductor device 202 of the third embodiment, a pad 212 is formed on the top surface of the semiconductor device 202 so that the surface of the pad 212 ascends in the direction 64 to which the extended portion 14b of the conductive wire is pulled. As shown in FIG. 8, if the surface of the pad 212 ascends in the direction 64 to which the extended portion 14b of the conductive wire is pulled, it is possible to secure a difference in height 80 between the surface of the pad 212 and the top surface of the semiconductor device 202 around the surface of the pad 212. Thus, it is possible to cause the top surface of the semiconductor device 202 to not exist in a range 78 through which the extended portion 214b of the conductive wire passes when pulling the extended portion 214b of the conductive wire from the pad 212. Consequently, since a drag mark will not be formed on the top surface of the semiconductor device 202 by the extended portion 214b of the conductive wire, the drag mark forming region can be eliminated from the pad 212. FIG. 5 is a diagram showing the periphery of the pad 212 in a direction that is perpendicular to the top surface of the semiconductor device, where the drag mark forming region is eliminated from the pad 212, and the surface of the pad 212 ascends in the direction from which the wire is pulled. As a result of eliminating the drag mark forming region, the projected length of the pad 212 in relation to the top surface of the semiconductor device is reduced to L3. With the semiconductor device 202, the area of the pad region 210 can be reduced as shown with the arrow 66b. Consequently, the area of the active region 208 can be enlarged, and the electrical properties of the semiconductor device 202 can be improved.

Fourth Embodiment

Figure 9:
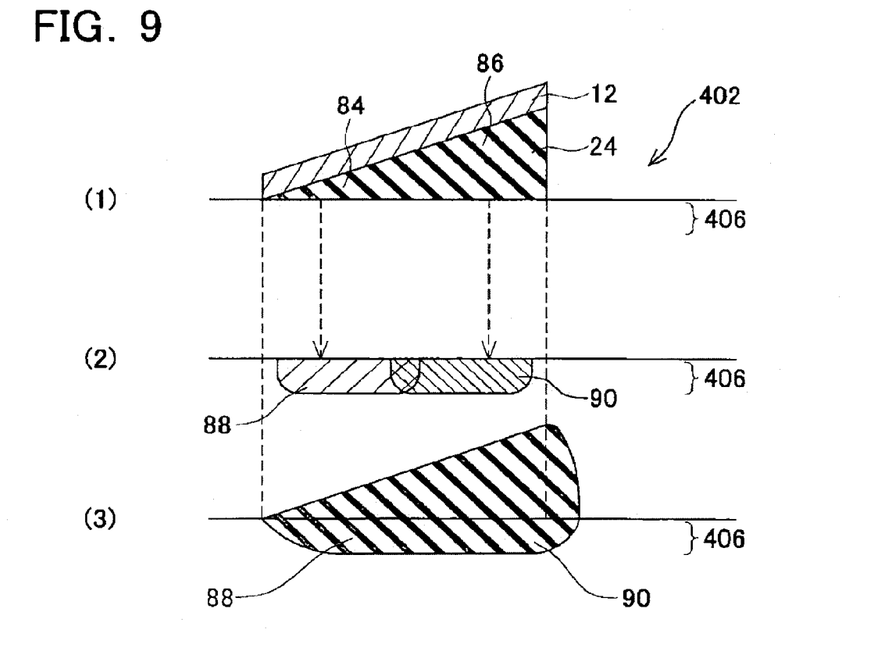
FIG. 9 shows a cross section of a semiconductor device 402 of the fourth embodiment.

FIG. 9-(1) shows the semiconductor device 402 according to the fourth embodiment of the present invention. With the semiconductor device 402, an oxide film 24 is formed between the pad 12 and the semiconductor substrate 406. As shown in FIG. 9-(2), when forming the oxide film 24, ions for slightly increasing an oxidation rate are injected in advance into a surface region 88 of the semiconductor substrate 406. The surface region 88 is corresponding to a thin part 84 of the oxide film 24. In addition, ions for greatly increasing the oxidation rate are injected in advance into a surface region 90 of the semiconductor substrate 406. The surface region 90 is corresponding to a thick part 86 of the oxide film 24. Oxidation treatment is subsequently performed. As shown in FIG. 9-(3), at the surface region 88 of the semiconductor substrate 406 into which ions for slightly increasing an oxidation rate were injected, an oxide film is formed in the semiconductor substrate 406 as a result of the oxidation, and the top surface of the semiconductor substrate 406 within and around the region 88 is bulging slightly. Moreover, at the region 90 into which ions for greatly increasing the oxidation rate were injected, an oxide film is formed in the semiconductor substrate 406 as a result of the oxidation, and the top surface of the semiconductor substrate 406 within and around the region 90 is bulging greatly. An oxide film 24 in which the thickness thereof is changing (sloping) is formed between the two regions. By forming a pad 12 on the surface of the oxide film 24 in which the thickness thereof is sloping, a pad 12 having a surface that is sloping with respect to the top surface of the semiconductor device 402 around the pad 12 can be easily formed as shown in FIG. 9-(1).

Fifth Embodiment

Figure 10:
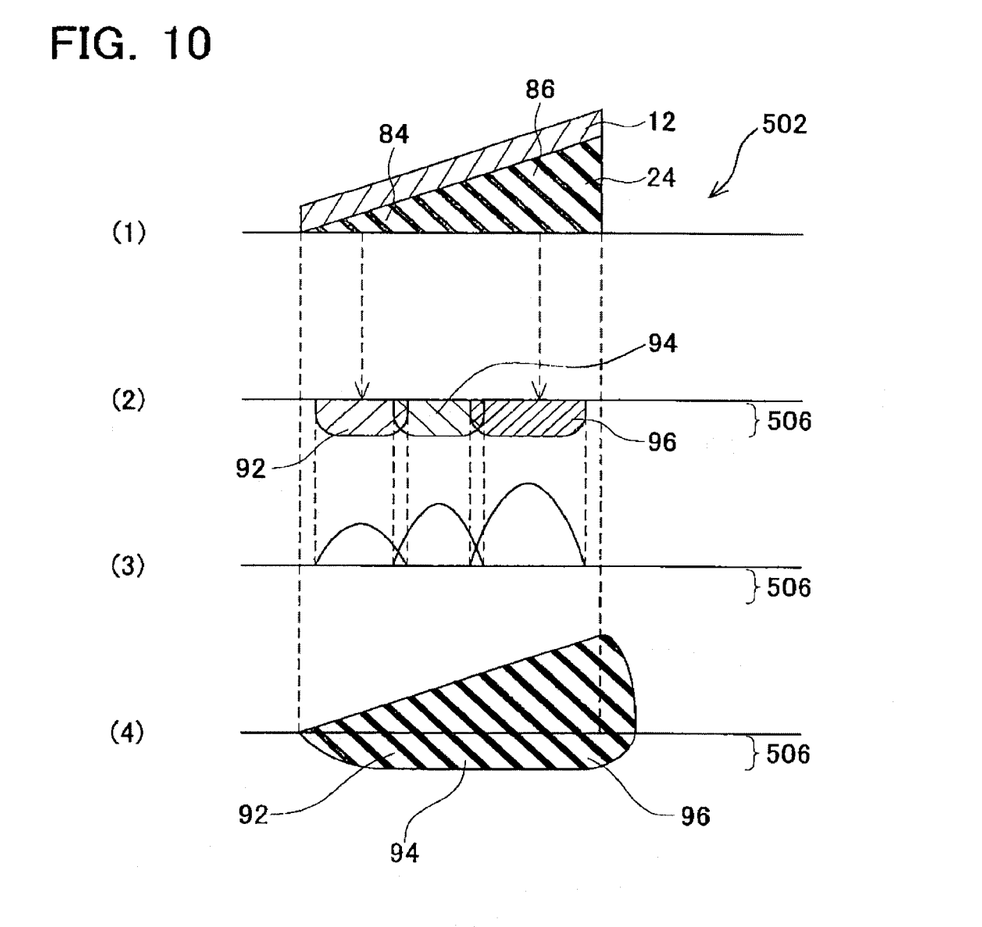
FIG. 10 shows a cross section of a semiconductor device 502 of the fifth embodiment.

In substitute for changing the type of ions to be injected, the injection density of the ions can be changed. FIG. 10-(1) shows the semiconductor device 502 according to the fifth embodiment of the present invention. With the semiconductor device 502, an oxide film 24 is formed between the pad 12 and the semiconductor substrate 506. As shown in FIG. 10-(2), when forming the oxide film 24, ions for increasing an oxidation rate are injected into surface regions 92, 94, 96 of the semiconductor substrate 506. The surface region 92 is corresponding to a thin part 84 of the oxide film 24. Ions for increasing the oxidation rate are injected into the surface region 92 at a low density. The surface region 96 is corresponding to a thick part 86 of the oxide film 24. Ions for increasing the oxidation rate are injected into the surface region 96 at a high density. Into the surface region 94 between the surface region 92 and the surface region 96, ions for increasing the oxidation rate are injected at a moderate density. FIG. 10-(3) shows, with the vertical axis as the ion density, the ion density that was injected into the respective regions 92, 94, 96. In this embodiment, oxidation treatment is subsequently performed. As shown in FIG. 10-(4), at the surface region 92 of the semiconductor substrate 506 into which ions for increasing the oxidation rate were injected at a low density, an oxide film is formed in the semiconductor substrate 506 as a result of the oxidation, and the top surface of the semiconductor substrate 506 within and around the region 92 is bulging slightly. At the surface region 94 into which ions for increasing the oxidation rate were injected at a moderate density, another oxide film is formed in the semiconductor substrate 506 as a result of the oxidation, and the top surface of the semiconductor substrate 506 within and around the region 94 is bulging moderately. At the region 96 into which the ions for increasing the oxidation rate were injected at a high density, yet another oxide film is formed in the semiconductor substrate 506 as a result of the oxidation, and the top surface of the semiconductor substrate 506 within and around the region 96 is bulging greatly. An oxide film 24 in which the thickness thereof is changing (sloping) is formed between the two regions 92 and 96. By forming a pad 12 on the surface of the oxide film 24 in which the thickness thereof is sloping, a pad 12 having a surface that is sloping with respect to the top surface of the semiconductor device 502 around the pad 12 can be easily formed as shown in FIG. 10-(1).

Sixth Embodiment

FIG. 11 shows a device 100 embodying the present invention. The device 100 of this embodiment is a device having a first pad 102 and a second pad 104 whose surfaces are sloping. The pads 102, 104 are connected to each other by a conductive wire 122. The device of this embodiment comprises two planes of different heights: namely, a first plane 106 and a second plane 108. The first plane 106 is at a lower level than the second plane 108. The first plane 106 and the second plane 108 are mutually parallel. Additionally, the first and second planes 106, 108 are parallel to the top surface of the semiconductor device other than the pad. The first plane 106 includes a first connecting point 110, and the first pad 102 is formed on the first connecting point 110 of the first plane 106. One end of the conductive wire 122 is connected to the first pad 102. The second plane 108 includes a second connecting point 112, and a second pad 104 is formed on the second connecting point 112 of the second plane 108. The other end of the conductive wire 122 is connected to the second pad 104. With the device 100 of this embodiment, the first pad 102 of the first plane 106 at a lower level than the second plane 108 is sloping so that the first pad 102 ascends toward the second connecting point 112. The second pad 104 of the second plane 108 at a higher level than the first plane 108 is sloping so that the second pad 104 descends toward the first connecting point 110. Moreover, the surface of the first pad 102 and the surface of the second pad 104 are formed to be mutually parallel. If the first pad 102 and the second pad 104 would not be formed in a slope, as with the device 200 shown in FIG. 12, the difference in height 120 between the surface of the first pad 102 and the surface of the second pad 104 would be equivalent to the difference in height between the surface of the first plane 106 and the surface of the second plane 108. If the difference in height 120 is great, the conductive wire 122 cannot be stably connected to the first pad 102 and the second pad 104. As shown in FIG. 11, as a result of the first pad 102 and the second pad 104 being formed in a slope, the difference in height 116 between the surface of the first pad 102 and the surface of the second pad 104 can be reduced in comparison to the difference in height 114 between the surface of the first plane 106 and the surface of the second plane 108. As a result of reducing the difference in height 116, the conductive wire 122 can be stably connected to the first pad 102 and the second pad 104.

With the device of the present invention, preferably, the sloping surface of the first pad 102 and the sloping surface of the second pad 104 may be parallel to a plane including the first connecting point 110 and the second connecting point 112. Consequently, the difference in height existing between the surface of the first pad 102 and the surface of the second pad 104 can be effectively reduced.

Specific embodiments of the present teachings are described above, but those merely illustrate some representative possibilities for utilizing the teachings and do not restrict the claims thereof. The subject matter set forth in the claims includes variations and modifications of the specific examples set forth above. For example, with the semiconductor device 2 of the foregoing embodiments, although the cases explained therein had the pad 12 sloping in its entirety, however, at least a part of the pad 12 may alternately be sloping. In this configuration, the area of the pad region can also be reduced. For example, if the pad 12 contains both the bonding region 30 and the drag mark forming region 28, one of the bonding region 30 and the drag mark forming region 28 may be sloping. The area of the pad region 10 can be reduced in accordance with the area of the pad 12 which is formed in a sloping manner. Moreover, if the drag mark forming region 28 is formed in such a slope, the shape thereof does not necessarily have to be a plane. The drag mark forming region 28 may alternately be formed as a curve in a range where the region 28 does not interfere with the tool for gripping and pulling the extended portion 14b of the wire when the tool is moved. The method of forming the pad 12 in a slope is also not limited to the foregoing embodiments. The slope may also be formed using methods such as sputtering that is normally used for manufacturing the semiconductor device 2. In addition, the layer having a sloping surface to be formed below the pad 12 is not limited to the oxide film 24. For instance, it may also be formed by thickly laminating polysilicon or the like.

The technical elements disclosed in the specification or the drawings may be utilized separately or in all types of combinations, and are not limited to the combinations set forth in the claims at the time of filing of the application. Furthermore, the subject matter disclosed herein may be utilized to simultaneously achieve a plurality of objects or to only achieve one object.

The invention claimed is:

1. A method of manufacturing a semiconductor device, comprising:
    injecting first ions into a first surface region of a semiconductor substrate;
    injecting second ions into a second surface region of the semiconductor substrate, the second surface region being adjacent to the first surface region;
    oxidizing, after injecting the first ions into the first surface region and injecting the second ions into the second surface region, the first and second surface regions to form an oxide film having a thickness increasing along a direction from the first surface region to the second surface region, the first surface region with the first ions injected therein having a first oxidization rate higher than an oxidization rate of a third surface region of the semiconductor substrate outside the first and second surface regions, and the second surface region with the second ions injected therein having a second oxidization rate higher than the first oxidization rate; and
    forming a bonding pad on the oxide film within the first and second surface regions.

2. A method of claim 1, further comprising bonding a conductive wire on the bonding pad, the conductive wire extending along the direction from the first surface region to the second surface region.

3. A method of manufacturing a semiconductor device, comprising:
    injecting ions into a first surface region and a second surface region of a semiconductor substrate, the second surface region being adjacent to the first surface region, the ions being injected into the first surface region at a first dose and being injected into the second surface region at a second dose higher than the first dose;
    oxidizing, after injecting the ions into the first and second surface regions, the first and second surface regions to form an oxide film having a thickness increasing along a direction from the first surface region to the second surface region, the first surface region with the ions injected therein at the first dose having a first oxidization rate higher than an oxidization rate of a third surface region of the semiconductor substrate outside the first and second surface regions, and the second surface region with the ions injected therein at the second dose having a second oxidization rate higher than the oxidization rate of the third surface region of the semiconductor substrate; and
    forming a bonding pad on the oxide film within the first and second surface regions.

4. A method of claim 3, further comprising bonding a conductive wire on the bonding pad, the conductive wire extending along the direction from the first surface region to the second surface region.

* * * * *